United States Patent [19]

Waller et al.

[11] Patent Number: 4,980,582
[45] Date of Patent: Dec. 25, 1990

[54] HIGH SPEED ECL INPUT BUFFER FOR VERTICAL FUSE ARRAYS

[75] Inventors: William K. Waller, Boise, Id.; Thomas M. Luich, Campbell, Calif.

[73] Assignee: National Semiconductor Corporation, Santa Clara, Calif.

[21] Appl. No.: 306,780

[22] Filed: Feb. 3, 1989

[51] Int. Cl.⁵ .................. H03K 19/092; H03K 19/086
[52] U.S. Cl. ...................................... 307/475; 307/455
[58] Field of Search ........................ 307/475, 455, 467

[56] References Cited

U.S. PATENT DOCUMENTS

| | | | |
|---|---|---|---|
| 4,725,744 | 2/1988 | Yagyuu et al. | 307/455 |
| 4,841,176 | 6/1989 | Millhollan et al. | 307/475 |
| 4,843,262 | 6/1989 | Abe | 307/475 |
| 4,864,166 | 9/1989 | Gloaguen | 307/475 |

Primary Examiner—Stanley D. Miller
Assistant Examiner—Richard Roseen
Attorney, Agent, or Firm—Steven F. Caserza; Lee Patch

[57] ABSTRACT

An ECL input buffer is particularly well-suited for use with logic arrays where a large amount of current must be sunk by the row line, for example, when vertical fuse devices are used in an AND array. The input buffer provides means for pulling down the row line such that the entire amount of current sunk by the input buffer from the row line need not pass through a current source, thereby minimizing current consumption of the input buffer. A pull down current source is used which causes a pull down transistor to turn on, thereby pulling down the row line while requiring only the base current of the pull down transistor to be consumed by the current source. A pull up device is utilized and means are included for insuring that the pull up and pull down devices are not both turned on simultaneously, thereby preventing a current spike through the pull up and pull down means.

11 Claims, 5 Drawing Sheets

HIGH SPEED ECL INPUT BUFFER FOR VERTICAL FUSE ARRAYS

FIELD OF THE INVENTION

This invention pertains to circuitry for driving fuse programmable arrays, and which is particularly well suited for driving fuse arrays utilizing vertical fuses.

BACKGROUND

Arrays of fuse devices, and more particularly, arrays fabricated utilizing emitter coupled logic (ECL) technology are well known in the prior art. Such fuse arrays are suitable for forming programmable read only memories (PROMs) and programmable logic arrays (PLAs). Emitter coupled logic technology is particularly well suited for extremely fast devices since opposing transistors are forced to share a limited amount of current made available by a current source in such a manner that neither of the two transistors ever saturate.

One fuse element suitable for use in such devices is the so-called lateral fuse, such as the metal fuse depicted in FIG. 1 which may be formed of any suitable metal or interconnect material, typically titanium tungsten. When utilizing a lateral fuse device with ECL circuitry, the most appropriate fuse array configuration is the OR configuration, since the ECL input (which has limited current sink capability) will only sink transient (capacitive) current. Such an OR array is shown in the schematic diagram of FIG. 2. FIG. 2 shows a plurality of N columns 204-1 through 204-N each containing a current source 206-1 through 206-N tending to pull nodes 209-1 through 209-N low. Row line 201 serves to receive an input signal which is supplied to the base of transistors 202-1 through 202-N, having their collectors connected to VCC and their emitters connected through fuses 203-1 through 203-N to node 209-1 through 209-N. Fuses 203-1 through 203-N are capable of being individually programmed (i.e., altered from their initial state of being short circuits to a programmed state of being an open circuit) in a well known manner, for example by providing a high signal on row line 201 and providing a programming voltage in excess of VCC and typically 10 volts to the collectors of those of transistors 202-1 through 202-N associated with those of fuses 203-1 through 203-N which are desired to be programmed.

A single current source circuit containing transistor load device 207 and resistor 208 serves to supply current from a positive supply voltage VCC through diodes 205-1 to 205-N to nodes 209-1 through 209-N. Resistor 208 supplies current required by current sources 206-1 through 206-N when such current is not supplied by transistors 202-1 through 202-N. This occurs when row line 201 goes low, or a fuse 203-1 through 203-N associated with a particular current source 206-1 through 206-N is blown (open). Transistor 207 serves to limit the voltage across resistor 208 when more than one current source 206-1 through 206-N is drawing current from VCC at the same time.

One embodiment of a circuit suitable for providing appropriate driving signals to row line 201 is shown in the schematic diagram of FIG. 3. Row driver circuit 300 is an ECL circuit utilizing a first current source 310 to control pull up transistors 306 and 314 which serve to supply pull up current to $\overline{ROW}$ line 308 and ROW line 315, respectively. Circuit 300 includes a second current source 312 which serves to control pull down transistors 304 and 313 which serve to sink current from $\overline{ROW}$ line 308 and ROW line 305, respectively. An input signal defines whether it is desired to source current to row line 315 (i.e., apply a logical one signal to row line 315) or sink current from row line 315 (i.e., apply a logical zero signal to row line 315), and simultaneously apply the inverse binary signal to $\overline{ROW}$ line 308. Input lead 301 is connected to the base of transistor 302, having its collector connected to VCC. The emitter of transistor 302 is connected to pull down current source 303 and to the bases of transistors 304 and 305. In a similar manner, a bias voltage VBB having a value approximately between a logical zero and a logical one voltage level of the input signal applied to input lead 301, is applied to the base of transistor 316. The collector of transistor 316 is connected to VCC, and its emitter is connected to pull down current source 317 and to the bases of transistors 311 and 313. Thus, as is well known to those of ordinary skill in the art of ECL circuit design, when the input signal applied to input lead 301 is low (i.e, less than VBB) transistors 304 and 305 are turned off and transistors 311 and 313 are turned on. With transistors 304 and 305 turned off, current is supplied from VCC through resistor 307 to the base of transistor 306, turning on transistor 306 and applying current to $\overline{ROW}$ line 308, thus providing a logical one signal to $\overline{ROW}$ line 308. Similarly, with transistors 311 and 313 turned on, the voltage applied to the base of row line pull up transistor 314 is low, keeping row line pull up transistor 314 turned off. At the same time, transistor 313 is turned on, thus pulling row line 315 low, to a logical zero value.

Since ECL input buffer 300 includes active pull up transistors 306 and 314 having low output impedance, and pulls down by way of current source 312 having medium to high output impedance, circuit 300 is very effective in driving the high input impedance of row line 201 of the emitter follower array of FIG. 2. Since no DC current is sourced by row line 201 of FIG. 2, ECL buffer 300 of FIG. 3 need only sink capacitive current from row line 201. This is acceptable, since the medium to high input impedance of circuit 300 is capable of providing only small currents. Conversely, a small DC current is sunk by row line 201, in the amount of the sum of the current supplied current sources 206-1 through 206-N, divided by the current gain or beta of transistors Q202-1 through Q202-N, respectively. This small amount of DC current which is sunk by row line 201 is easily provided by the low output impedance of transistors 306 and 314 of the buffer of FIG. 3.

An alternative to the lateral fuse device of FIG. 1 is the so-called vertical fuse, as depicted in cross-sectional view in FIG. 4a. Vertical fuse 40 of FIG. 4a is well known in the prior art and includes buried collector 41, substrate 42, base region 43, and emitter 44. Base region 43 is doped to an opposite conductivity type as buried collector 41, substrate 42, and emitter 44, thereby forming a vertical bipolar transistor. When used as a fuse device, emitter 44 and buried collector 41 serve as the two leads of the fuse device and, in its unprogrammed state, remains an open circuit. However, fuse device 40 is capable of being programmed, for example by the application of a sufficient amount of programming current applied at a sufficiently high voltage to cause breakdown of the PN junction formed between emitter 44 and base 43. When this happens, emitter 44 and base 43 become shorted, with the result that a PN diode, rather than an open circuit, is formed between the two terminals of fuse device 40, i.e., emitter 44 and buried collector 41. The use of a vertical fuse device comprising a floating base bipolar transistor forming an open circuit when unprogrammed and which models a diode when programmed is depicted in FIG. 4b.

Vertical fuse arrays form a diode "AND" configuration, as shown in FIG. 5. Array 500 includes row line 501 and columns 503-1 through 503-N. Connected between row line 501 and columns 503-1 through 503-N are vertical fuse elements 502-1 through 502-N, respectively. Columns 503-1 through 503-N are applied with current from VCC terminal 504 through resistors 505-1 through 505-N, respectively. Transistors 506-1 through 506-N have their bases connected to columns 503-1 through 503-N, their collectors connected to VCC, and their emitters connected in common to the input lead of sense amplifier 507. In this manner, sense amplifier 507 provides an output signal on output lead 510 indicating whether all of fuses 502-1 through 502-N have been programmed (i.e., changed from an open circuit to a diode providing a short circuit between columns 503-1 through 503-N to row line 501). In other words, when any one or more of fuses 502-1 through 502-N remain unprogrammed (open circuit), the associated column is not pulled low, turning on the associated one of transistors 506-1 through 506-N, and causing sense amplifier 507 to provide a logical one output signal on output lead 510. Conversely, when all of fuses 502-1 through 502-N are programmed to provide a short circuit between columns 503-1 through 503-N to row line 501, columns 503-1 through 503-N are all pulled low, thereby preventing any of transistors 506-1 through 506-N from turning on, causing sense amplifier 507 to provide a logical zero output signal on output lead 510.

As is the case with OR array 200 of FIG. 2, row line 501 must be driven by an input buffer circuit. Row line 501 can be driven by input buffer circuit 300 of FIG. 3, but only if pull down current source 312 is made sufficiently large. For example, in the AND array of FIG. 5, the current flowing from each column 503-1 through 503-N through a programmed fuse 502-1 through 502-N to row line 501 is approximately 0.5 milliamps. For a typical PLA array having approximately 64 columns, each row line must sink between 15 to 30 milliamps. However, typical PLA devices include a plurality of row lines allowing for greater sophistication of the PLA. For a typical PLA having 16 row lines, the current drain for the 16 current sources alone is approximately 240 to 480 milliamps, a considerable amount of power. Accordingly, there arises the need for minimizing the power consumption of ECL PLAs utilizing an AND array of fuse devices.

SUMMARY

In accordance with the teachings of this invention, a novel ECL input buffer is provided which is particularly well-suited for use with logic arrays where a large amount of current must be sunk by the row line, for example, when vertical fuse devices are used in an AND array. In accordance with the teachings of this invention, the input buffer provides means for pulling down the row line such that the entire amount of current sunk by the input buffer from the row line need not pass through a current source, thereby minimizing current consumption of the input buffer. In one embodiment of this invention, a pull down current source is used which, in response to an appropriate level of an input signal applied to the input buffer, causes a pull down transistor to turn on, thereby pulling down the row line while requiring only the base current of the pull down transistor to be consumed by the current source. In one embodiment of this invention, a pull up device is utilized and means are included for insuring that the pull up and pull down devices are not both turned on simultaneously, thereby preventing a current spike through the pull up and pull down devices.

BRIEF DESCRIPTION OF THE DRAWINGS

FIG. 4b is a schematic representation of the unprogrammed and programmed states of the vertical fuse device of FIG. 4a;

DETAILED DESCRIPTION

Figure 1:
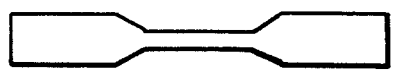
FIG. 1 is a diagram depicting a typical prior art lateral fuse.
Figure 4A:
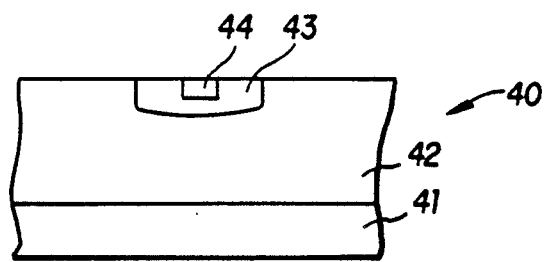
FIG. 4a is a cross sectional view of a floating base bipolar transistor used as a vertical fuse device of the prior art.
Figure 2:
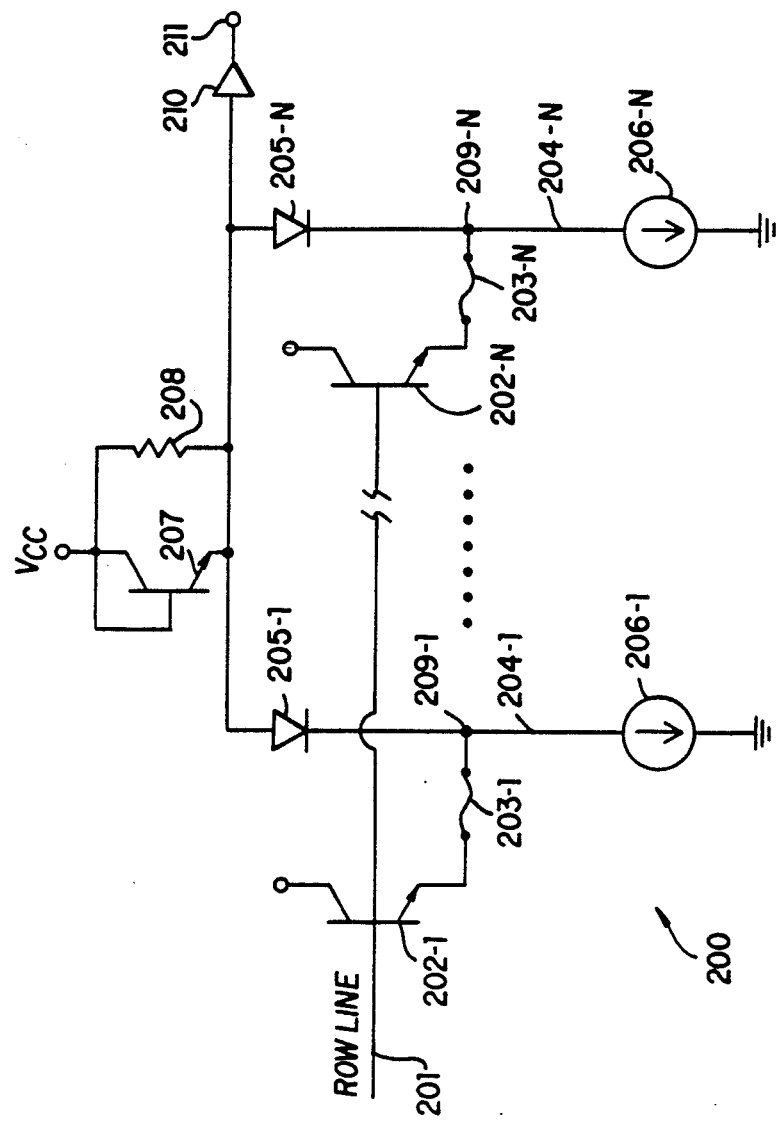
FIG. 2 is a schematic diagram depicting a typical prior art OR array utilizing lateral fuses.
Figure 3:
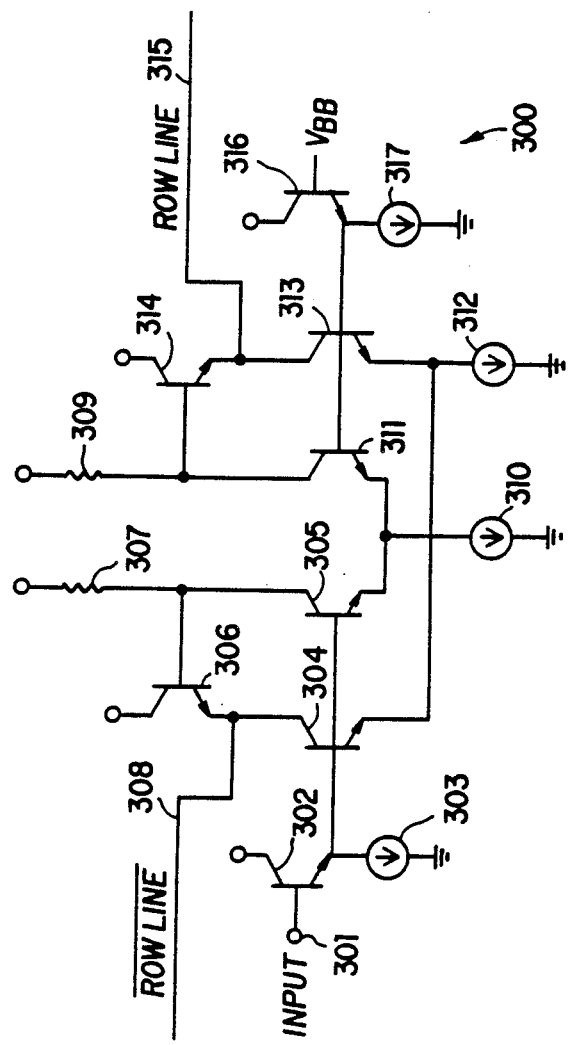
FIG. 3 is a schematic diagram of a prior art input buffer suitable for use in driving the row line of the array of FIG. 2.
Figure 5:
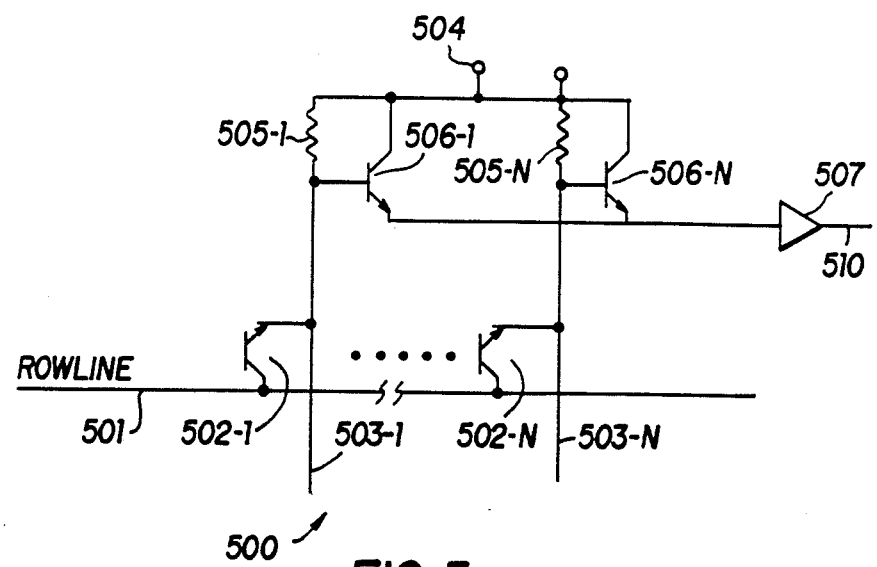
FIG. 5 is a schematic diagram of an "AND" array.
Figure 4B:
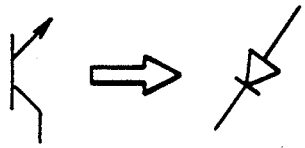
Figure 6:
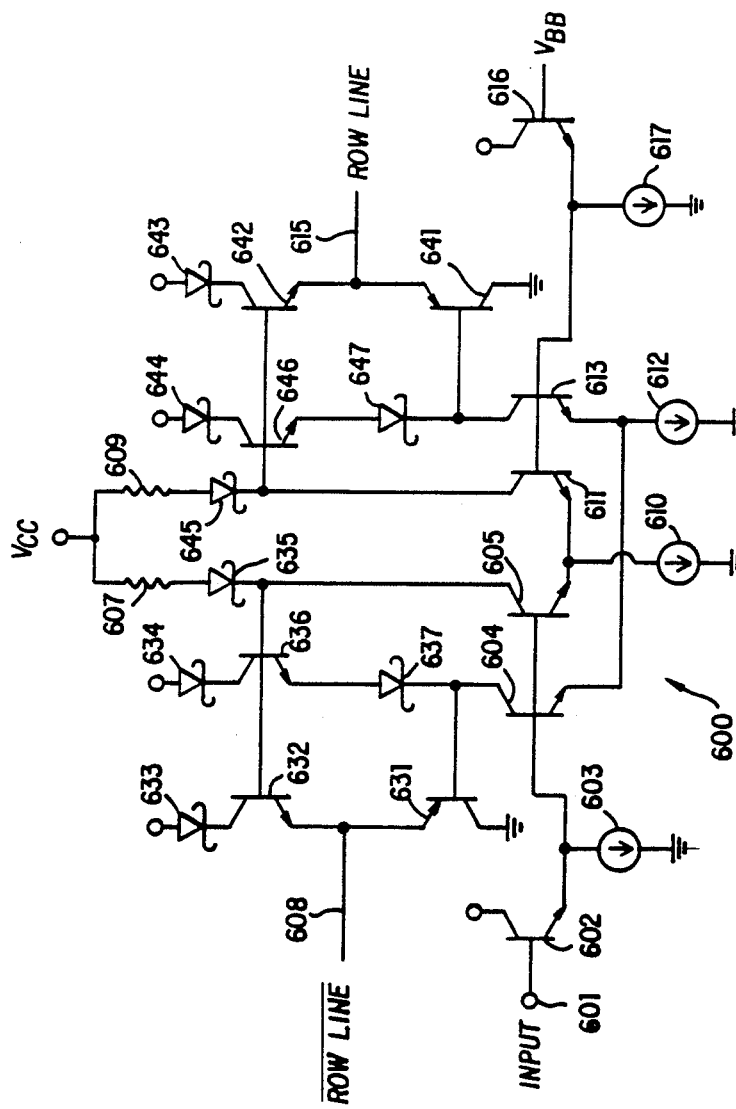
FIG. 6 is a schematic diagram of one embodiment of a novel input buffer constructed in accordance with the teachings of this invention.

Referring to FIG. 6, an input signal is applied to input lead 601, and a bias voltage VBB is applied to the base of transistor 616, with the bias voltage having a voltage level between the voltage level of a logical zero and logical one input signal applied to input lead 601. Current source 610 is used to control the pull up devices and current source 612 is used to control the pull down devices. ECL transistor pairs 605, 611; and 604, 613 are used to steer current from current sources 610 and 612, respectively, in response to the input signal. With a logical one input signal applied to input lead 601, transistor 602 turns on, and current from current sources 612 and 610 are steered through transistor 604 and 605, respectively. With no current passing through transistor 611, the base of pull up transistor 642 is pulled high through the path from VCC through resistor 609 and Schottky diode 645. This causes transistor 642 to turn on, applying current from VCC through Schottky diode 643, through transistor 642, to ROW line 615, thereby pulling up ROW line 615. At the same time, $\overline{\text{ROW}}$ line 608 is pulled low in a manner which will be readily understood with reference to the operation of the circuit to pull down ROW line 615.

Conversely, with a logical zero input signal applied to input terminal 601, transistor 602 turns off, and current is steered from current sources 612 and 610 through transistor 613, and 611, respectively. With current being pulled through transistor 611, the base of transistor 642 is pulled low, thereby turning off transistor 642 and current is no longer supplied to pull up row line 615. With current flowing through transistor 613, the base of transistor 641 is pulled lower, thereby turning on PNP transistor 641 and in turn sinking current from row line 615, thus pulling down row line 615. Of importance, pull down current source 612 need only sink a relatively small amount of current, i.e., the base current of pull down transistor 641. For a typical PNP transistor 641 having a beta of 10, only 1.5 milliamps of base current is needed to cause a 15 milliamp pull down current from row line 615. Thus, the magnitude of current which must be sunk by current source 612 is significantly less than the desired amount of pull down current from the row line.

In one embodiment of this invention, the base of pull down transistor 641 is connected to the emitter of transistor 646 with a direct connection (not shown). In the embodiment shown in FIG. 6, the base of transistor 641 is connected to the emitter of transistor 646 via Schottky diode 647, thereby reducing the change in voltage applied to the base of transistor 646 required to cause transistors 641 and 642 to switch, thereby increasing switching speed. Thus, with a high input signal applied to input lead 601 transistors 611 and 613 are off, the bases of transistors 646 and 642 are high, transistor 641 has no base current and thus is off, as is transistor 646 since it has no emitter current. At this time, transistor 642 is turned on, pulling up row line 615.

Conversely, with a low input signal applied to input lead 601, transistors 611 and 613 are on, the bases of transistors 646 and 642 are low, transistor 642 is off, and row line 615 is pulled down through conducting transistor 641. At this time, the voltage applied to row line 615 is equal to $VB(642) - VBE(646) - V_f(647) + VBE(641) = VB(642) - V_f$, where VB(642) is the base voltage of transistor 642;

VBE(646) is the base-emitter voltage of transistor 646;

VBE(641) is the base-emitter voltage of transistor 641 which is equal to VBE(646); and $V_f(647)$ is the forward voltage drop across Schottky transistor 647.

In one embodiment of this invention, as depicted in FIG. 6, Schottky diodes 633, 634, 643 and 644 are connected between VCC and the collectors of transistors 632, 636, 642, and 646, respectively, in order to prevent breakdown during programming. During programming, any deselected row may be pulled much higher than VCC (typically to about 10 volts). Schottky diodes 633, 634, 643 and 644 block any breakdown path to VCC which might otherwise occur due to the reverse breakdown voltage between the emitter and collector (BVECR) of transistors 646 and 642, or the emitter base breakdown voltage (BVEBO) through resistor 609 to VCC.

Although the foregoing invention has been described in some detail by way of illustration and example for purposes of clarity of understanding, it will be readily apparent to those of ordinary skill in the art in light of the teachings of this application that certain changes and modifications may be practiced within the scope of the appended claim.

What is claimed is:

1. A circuit comprising:
   an input terminal for receiving an input signal;
   a pair of complementary output terminals for providing a complementary output signal as a function of said input signal;
   a pair of pull up means, each coupled between a pull up supply and a respective one of said output terminals;
   a pair of pull down means, each coupled between a pull down supply and a respective one of said output terminals; and
   a pair of pull down control means, operating out of phase and each comprising:
   a first current source; and
   switch means operative in response to said input signal and having a first current handling terminal coupled to said current source and a second current handling terminal for providing a pull down control signal to an associated one of said pull down means.

2. A circuit as in claim 1 wherein each of said pull down means comprises a first transistor having an first current handling lead coupled to a respective one of said output terminals, a second current handling lead coupled to said pull down supply, and a control terminal for receiving a respective one of said pull down control signals.

3. A circuit as in claim 2 wherein each of said pull down control means comprises a pair of transistors, each having a first current handling terminal coupled in a common to a current source, a first transistor of said pair of transistors also having a control terminal coupled to said input terminal, a second transistor of said pair of transistors also having a second current handling terminal coupled to said control terminal of said first transistor of an associated one of said pull down means, and a control terminal connected to a bias potential.

4. A circuit as in claim 2 wherein said pull down control means comprises:
   a second pair of transistors each having a first current handling lead coupled to said first current source, a second current handling lead coupled to said control terminal of said first transistor of an associated one of said pull down means, and a control terminal;
   bias means coupled to said control terminal of a first one of said second pair of transistors; and
   means for coupling said input signal to said control terminal of a second one of said second pair of transistors.

5. A circuit as in claim 4 wherein said bias means comprises a second current source and a third transistor having a first terminal coupled to a supply voltage, a second terminal coupled to said second current source and to said control terminal of said first one of said second pair of transistors, and a control terminal coupled to a bias voltage.

6. A circuit as in claim 4 which further comprises a set of additional means, each coupled to said control terminal of a first transistor of an associated one of said pull down means, said additional means serving to pull up said control terminal of a first transistor of an associate one of said pull down means when said pull down control means is not pulling down said control terminal of said first transistor.

7. A circuit as in claim 6 wherein each said additional means comprises a pull up transistor having a first current handling terminal coupled to a supply voltage, a second current handling terminal coupled to said control terminal of a first transistor of an associated one of said pull down means, and a control terminal coupled to receive a control signal which is a function of said input signal.

8. A circuit as in claim 7 wherein each said additional means further comprises a pair of transistors, each having a first current handling terminal coupled in a common to a third current source, a first transistor of said pair of transistors also having a control terminal coupled to said input terminal, a second transistor of said pair of transistors also having a second current handling terminal coupled to said control terminal of said pull up transistor and said second transistor having a control terminal coupled to a bias potential.

9. A circuit as in claim 2 wherein: said pair of pull down control means
- a second transistor having a first current handling terminal coupled to said control terminal of a first transistor of an associated one of said pull down means, a second current handling terminal coupled to said first current source, and a control terminal coupled to said input terminal;
- a third transistor having a first current handling terminal coupled to said control terminal of a second transistor of an associated one of said pull down means, a second current handling terminal coupled to said first current source, and a control terminal coupled to a bias potential;

which further comprises:
- a first pull up transistor having a first current handling terminal coupled to a supply voltage, a second current handling terminal coupled to said control terminal of said first transistor of an associated one of said pull down means, and a control terminal coupled to receive a control signal which is a function of said input signal;
- a second pull up transistor having a first current handling terminal coupled to a supply voltage, a second current handling terminal coupled to said control terminal of said second transistor of an associated one of said pull down means, and a control terminal coupled to receive a control signal which is a function of said input signal;
- a fourth transistor having a first current handling terminal coupled to a second current source a second current handling terminal coupled to said control terminal of said first pull up transistor, and a control terminal coupled to said input terminal; and
- a fifth transistor having a first current handling terminal coupled to said second current source a second current handling terminal coupled to said control terminal of said second pull up transistor, and a control terminal coupled to a bias potential.

10. A circuit as in claim 9 wherein said control terminals of said third and fifth transistors are coupled to the same bias potential.

11. A circuit as in claim 10 wherein each of said pull up means comprises a transistor having a first current handling lead connected to said pull up supply, a second current handling lead connected to an associated one of said output terminals, and a control terminal for receiving a control signal as a function of said input signal.

* * * * *